US009646919B2

(12) United States Patent
St. Germain et al.

(10) Patent No.: US 9,646,919 B2
(45) Date of Patent: May 9, 2017

(54) SEMICONDUCTOR PACKAGE FOR A LATERAL DEVICE AND RELATED METHODS (71) Applicant: SEMICONDUCTOR COMPONENTS INDUSTRIES, LLC, Phoenix, AZ (US)

(72) Inventors: Stephen St. Germain, Scottsdale, AZ (US); Roger Arbuthnot, Mesa, AZ (US); Peter Moens, Zottegem (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/166,065

(22) Filed: May 26, 2016

(65) Prior Publication Data

US 2016/0276250 A1    Sep. 22, 2016

Related U.S. Application Data (62) Division of application No. 14/453,703, filed on Aug. 7, 2014, now Pat. No. 9,379,193.

(51) Int. Cl.
*H01L 25/07* (2006.01)
*H01L 23/495* (2006.01)
*H01L 29/78* (2006.01)
*H01L 23/31* (2006.01)
*H01L 23/498* (2006.01)
*H01L 23/522* (2006.01)
*H01L 23/482* (2006.01)
(Continued)

(52) U.S. Cl.
CPC .... *H01L 23/49524* (2013.01); *H01L 21/4825* (2013.01); *H01L 21/561* (2013.01); *H01L 21/565* (2013.01); *H01L 21/78* (2013.01); *H01L 23/3114* (2013.01); *H01L 23/482* (2013.01); *H01L 23/4824* (2013.01); *H01L 23/49562* (2013.01); *H01L 24/83* (2013.01); *H01L 29/0696* (2013.01); *H01L 29/2003* (2013.01); *H01L 29/41758* (2013.01); *H01L 29/78* (2013.01); *H01L 23/3107* (2013.01)

(58) Field of Classification Search
CPC ............... H01L 23/49524; H01L 21/78; H01L 23/49562; H01L 29/2003; H01L 21/565; H01L 23/3114; H01L 21/4825
USPC .................................. 257/250–260, 330–340
See application file for complete search history.

(56) References Cited

U.S. PATENT DOCUMENTS

6,040,626 A    3/2000   Cheah et al.
6,236,107 B1   5/2001   Chan et al.
(Continued)

*Primary Examiner* — Marc Armand
*Assistant Examiner* — Nelson Garces
(74) *Attorney, Agent, or Firm* — Adam R. Stephenson, LTD.

(57) ABSTRACT

A semiconductor package. Implementations may include a lateral device that may include a lateral semiconductor device including one of interspersed and interdigitated source and drain regions and one or more gate regions, a single layer clip, and a leadframe. The single layer clip may be coupled to the one of interspersed and interdigitated source and drain regions and the one or more gate regions and to the leadframe. The single layer clip may be configured to redistribute and to isolate source, drain, and gate signals passing into and out from the lateral semiconductor device during operation of the semiconductor device package.

14 Claims, 6 Drawing Sheets (51) Int. Cl.

| | |
|---|---|
| *H01L 29/417* | (2006.01) |
| *H01L 29/06* | (2006.01) |
| *H01L 23/00* | (2006.01) |
| *H01L 21/56* | (2006.01) |
| *H01L 21/48* | (2006.01) |
| *H01L 21/78* | (2006.01) |
| *H01L 29/20* | (2006.01) |

(56) References Cited

U.S. PATENT DOCUMENTS

| | | | |
|---|---|---|---|
| 6,256,200 | B1 | 7/2001 | Lam et al. |
| 6,870,254 | B1 | 3/2005 | Estacio et al. |
| 6,891,256 | B2 | 5/2005 | Joshi et al. |
| 2005/0139891 | A1* | 6/2005 | Beach .................. H01L 29/0692 |
| | | | 257/306 |
| 2007/0138606 | A1 | 6/2007 | Brailey |
| 2008/0054438 | A1 | 3/2008 | St. Germain et al. |
| 2009/0057854 | A1 | 3/2009 | Gomez |
| 2010/0109135 | A1 | 5/2010 | Jereza |
| 2013/0285260 | A1* | 10/2013 | Denison .................. H01L 25/07 |
| | | | 257/777 |
| 2014/0264804 | A1 | 9/2014 | Terrill et al. |
| 2015/0001692 | A1 | 1/2015 | Tsai et al. |
| 2015/0270194 | A1 | 9/2015 | Otremba et al. |

\* cited by examiner

SEMICONDUCTOR PACKAGE FOR A LATERAL DEVICE AND RELATED METHODS

CROSS REFERENCE TO RELATED APPLICATIONS

This application is a divisional application of the earlier U.S. Utility Patent Application to St. Germain, et al. entitled "Semiconductor Package for a Lateral Device and Related Methods," application Ser. No. 14/453,703, filed Aug. 7, 2014, now pending, the disclosure of which is hereby incorporated entirely herein by reference.

BACKGROUND

1. Technical Field

Aspects of this document relate generally to packages for semiconductor devices, such as systems and methods used to connect a semiconductor die to associated circuitry.

2. Background Art

Conventional semiconductor packages connect a semiconductor die to a motherboard or other associated circuitry and provide thermal and environmental protection for the device. Examples of conventional semiconductor packages include packages that include a leadframe to which the semiconductor die is coupled before being overmolded with mold compound. The leads of the leadframe that extend beyond the mold material are then used as electrical connections to the die inside the package.

SUMMARY

Implementations of semiconductor packages including a lateral device may include a lateral semiconductor device including one of interspersed and interdigitated source and drain regions and one or more gate regions, a single layer clip, and a leadframe. The single layer clip may be coupled to the one of interspersed and interdigitated source and drain regions and the one or more gate regions and to the leadframe. The single layer clip may be configured to redistribute and to isolate source, drain, and gate signals passing into and out from the lateral semiconductor device during operation of the semiconductor device package.

Implementations of semiconductor packages may include one, all, or any of the following:

Mold compound may be further included that encloses the lateral semiconductor device, a majority of the single layer clip, and a side of the leadframe facing the lateral semiconductor device.

The lateral semiconductor device may further include a plurality of source pads and a plurality of drain pads coupled to the source and the drain regions and to the one or more gate regions where the plurality of source pads and the plurality of drain pads are arranged in one of an interspersed arrangement and an interdigitated arrangement with respect to each other. The device may also include a plurality of source tracks coupled to the plurality of source pads were the plurality of source tracks include a plurality of source standoff contacts. The device may include a plurality of drain tracks couple to the plurality of drain pads where the plurality of drain tracks includes a plurality of drain standoff contacts. The device may also include at least one gate pad where the at least one gate pad is coupled to one or more gate standoff contacts.

The semiconductor package may further include where the single layer clip includes at least one source finger, at least one drain finger, and at least one gate finger where each of the at least one source, drain, and gate fingers are coupled with the plurality of source and drain standoff contacts and the one or more gate standoff contacts, respectively.

The plurality of source standoff contacts, the plurality of drain standoff contacts, and the one or more gate standoff contacts are each arranged in a staggered pattern along a length of the at least one source finger, the at least one drain finger, and the at least one gate finger, respectively.

The plurality of source standoff contacts, the plurality of drain standoff contacts, and the one or more gate standoff contacts are configured to self align to the single layer clip during a reflow process used during fabrication of the semiconductor package.

The leadframe may include at least one source section, at least one drain section, and at least one gate section. Each of the at least one source, drain, and gate sections may include a source clip contact, a drain clip contact, and a gate clip contact, respectively.

The source clip contact, drain clip contact, and gate clip contact may extend from a plane of the leadframe oriented parallel to the single layer clip. The leadframe may be coupled to the single layer clip at the source clip contact, the drain clip contact, and the gate clip contact.

The at least one source section, the at least one drain section, and the at least one gate section of the leadframe are physically separate from each other.

Implementations of a semiconductor device package may include a lateral semiconductor device that includes a plurality of source pads and a plurality of drain pads where the plurality of source pads and the plurality of drain pads are arranged in one of an interspersed arrangement and an interdigitated arrangement with respect to each other. The package may also include a plurality of source tracks coupled to the plurality of source pads where the plurality of source tracks includes a plurality of source standoff contacts. The package may include a plurality of drain tracks are coupled to the plurality of drain pads where the plurality of drain tracks include a plurality of drain standoff contacts. The package may include at least one gate pad where the at least one gate pad is coupled to one or more gate standoff contacts. The package may also include a single layer clip including at least one source finger, at least one drain finger, and at least one gate finger where each of the at least one source, drain, and gate fingers are coupled with the plurality of source and drain standoff contacts, and with the one or more gate standoff contacts, respectively. The package may include a leadframe including at least one source section, at least one drain section, and at least one gate section where each of the at least one source, drain, and gate sections include a source clip contact, a drain clip contact, and a gate clip contact, respectively. The source clip contact, drain clip contact, and gate clip contact may extend from a plane of the leadframe oriented parallel to the single layer clip. The leadframe may be coupled to the single layer clip at the source clip contact, the drain clip contact, and the gate clip contact.

Implementations of semiconductor packages may include one, all, or any of the following:

Mold compound may be included that encloses the lateral semiconductor device, a majority of the single layer clip, and a side of the leadframe facing the lateral semiconductor device.

The plurality of source standoff contacts, the plurality of drain standoff contacts, and the one or more gate standoff contacts may be each arranged in a staggered pattern along a length of the at least one source finger and a length of the at least one drain finger, respectively.

The at least one source section, the at least one drain section, and the at least one gate section of the leadframe may be physically separate from each other.

The single layer clip may be configured to connect multiple signal types from the lateral semiconductor device when the single layer clip is coupled to the lateral semiconductor device during fabrication of the semiconductor package. The single layer clip may also be configured to isolate those multiple signal types following singulation of the semiconductor package.

The plurality of source standoff contacts, the plurality of drain standoff contacts, and the one or more gate standoff contacts are configured to self align to the single layer clip during a reflow process used during fabrication of the semiconductor package.

Implementations of semiconductor packages may be manufactured using implementations of a method of manufacture, where the method may include coupling a single layer clip including at least one source finger, at least one drain finger, and at least one gate finger to a plurality of source standoff contacts, a plurality of drain standoff contacts, and one or more gate standoff contacts, respectively, included in a lateral semiconductor device. The method may also include coupling a leadframe to the single layer clip where the leadframe includes at least one source section, at least one drain section, and at least one gate section. The method may also include one of overmolding and encapsulating the lateral semiconductor device, a majority of the single layer clip, and a face of the leadframe facing the lateral semiconductor device with a mold compound. The method may include singulating the at least one source finger, the at least one drain finger, and the at least one gate finger.

Implementations of a method of manufacture of a semiconductor device package may include one, all, or any of the following:

Coupling a leadframe to the single layer clip may further include coupling using a source clip contact, drain clip contact, and a gate clip contact included in each of the at least one source, drain, and gate sections, respectively.

The method may further include isolating source, drain, and gate regions of the lateral semiconductor device through the at least one source finger, the at least one drain finger, and the at least one gate finger of the single layer clip.

Isolating source, drain, and gate regions of the lateral semiconductor device may further include isolating using the at least one source section, the at least one drain section, and the at least one gate section of the leadframe which are physically separated from each other.

The method may further include forming a plurality of source pads and plurality of drain pads on the lateral semiconductor device where the plurality of source pads and the plurality of drain pads are arranged in one of an interspersed arrangement and an interdigitated arrangement with respect to each other. The method may further include forming a plurality of source tracks coupled to the plurality of source pads where the plurality of source tracks includes the plurality of source standoff contacts. The method may also include forming a plurality of drain tracks coupled to the plurality of drain pads where the plurality of drain tracks include the plurality of drain standoff contacts. The method may include forming at least one gate pad where the at least one gate pad is coupled to one or more gate standoff contacts.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended for a semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
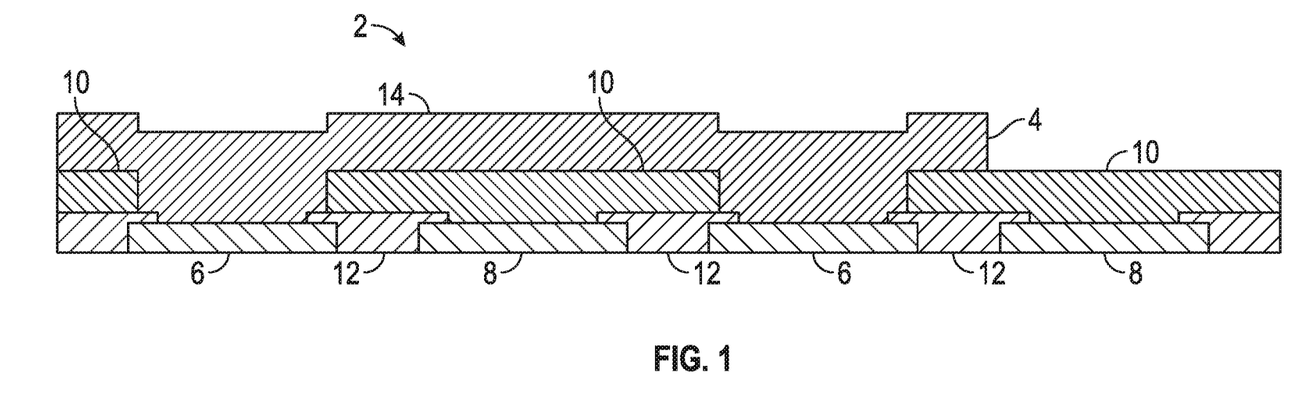
FIG. 1 is a cross sectional view of a lateral semiconductor device showing a source track, source pads, and drain pads.

Referring to FIG. 1, a cross sectional view of a source track 4 of a lateral semiconductor device 2 is illustrated. Many different types of lateral semiconductor devices may be incorporated into semiconductor packages constructed using the principles disclosed herein, including lateral semiconductor devices that include gallium nitride (GaN). An example of a GaN lateral semiconductor device may be found in World Intellectual Property Organization International Publication No. WO2014/035794 to Andrew P. Ritenour, entitled "Lateral Semiconductor Device With Vertical Breakdown Region," published Mar. 6, 2014, and filed Aug. 22, 2013, the disclosure of which is incorporated entirely herein by reference.

As illustrated, the source track 4 is coupled to source pads 6 and electrically isolated from drain pads 8. In the implementation illustrated in FIG. 1, the source track 4 is electrically isolated using a layer of polyimide 10 patterned over the top of the drain pads 8 and also through a layer of silicon nitride (SiN) 12 that is located between the drain pads 8 and the source pads 6 and which partially extends over the top of both of the pads. While polyimide 10 is illustrated being used for electrical insulation, in various implementations, SiN alone may be used to insulate. In such implementations, however, some polyimide may also be included for break down voltage protection purposes. In various implementations, the source pads 6 and drain pads 8 may take the form of pads that are substantially rectangular with sides that have similar length dimensions for all four sides; in other implementations, the source pads 6 and drain pads 8 may take the form of traces that have a length dimension much longer than a width dimension. In the implementation illustrated in FIG. 1, both types of pads may be shown, as the length dimension of trace-dimensioned pads extends perpendicularly to the plane of the cross section view.

As illustrated, in those locations where the polyimide 10 insulates the source track 4 from the drain pads 8, a raised portion of the source track 4 is present, which forms a source standoff contact 14. Where there are a plurality of drain pads 8, the presence of the polyimide 10 over those drain pads 8 underneath the source track 4 creates a plurality of source standoff contacts 14. In various implementations, however, it may not be the insulating material (polyimide and/or SiN) that forms part of the structure of the source standoff contacts 14, but they may be formed by selectively plating and/or depositing additional material onto the source track 4 to create a raised region. The source track 4 may be formed of an electrically conducting material such as a metal or metal alloy and may be composed of copper, aluminum, or any other platable or depositable electrically conductive material.

For the exemplary purposes of this disclosure, for the implementation of the source track 4 illustrated in FIG. 1, the height of the source standoff contact 14 above the SiN 12 may be about 20 microns, the height of the polyimide 10 may be about 5 microns, the width of source pads 6 may be about 30 microns, and the width of the drain pads 8 may be about 22 microns. The thickness of the source pads 6 and drain pads 8 may be about 4 microns and the width of the SiN 12 between the pads may be 6 microns.

Figure 2:
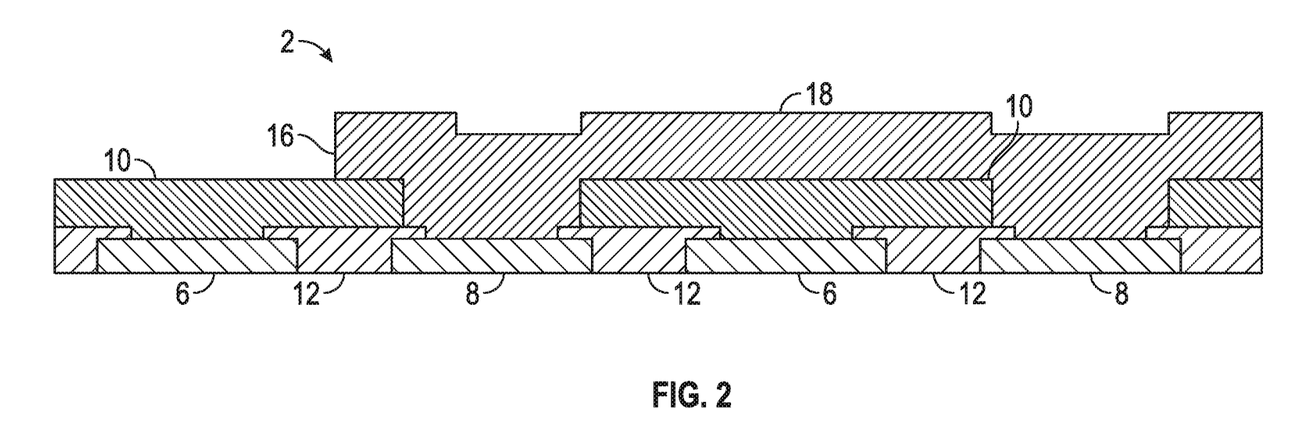
FIG. 2 is a cross sectional view of a lateral semiconductor device showing a drain track, drain pads, and source pads.

Referring to FIG. 2, a cross sectional view of the lateral semiconductor device 2 from FIG. 1 is illustrated taken along a drain track 16. As illustrated, the structure of the drain pads 8, source pads 6, and other structures is the same as those illustrated in FIG. 1 except that the polyimide 10 is now placed over the source pads 6 and the drain track 16 is accordingly placed in contact with the drain pads 8. As previously described, the polyimide 10 is used to provide electrical insulation between the drain track 16 and the source pads 6 as well as provide part of the structure of a plurality of drain standoff contacts 18 formed by the pattern of alternating source pads and drain pads. As in the implementation in FIG. 1, the SiN 12 region may be employed for electrical insulation in various implementations, though some polyimide may still be included for break down voltage protection purposes. The implementation in FIG. 2 has similar exemplary dimensions (height, width, etc.) for the various structures as the one in FIG. 1 and can be formed of the same types of materials.

Figure 3:
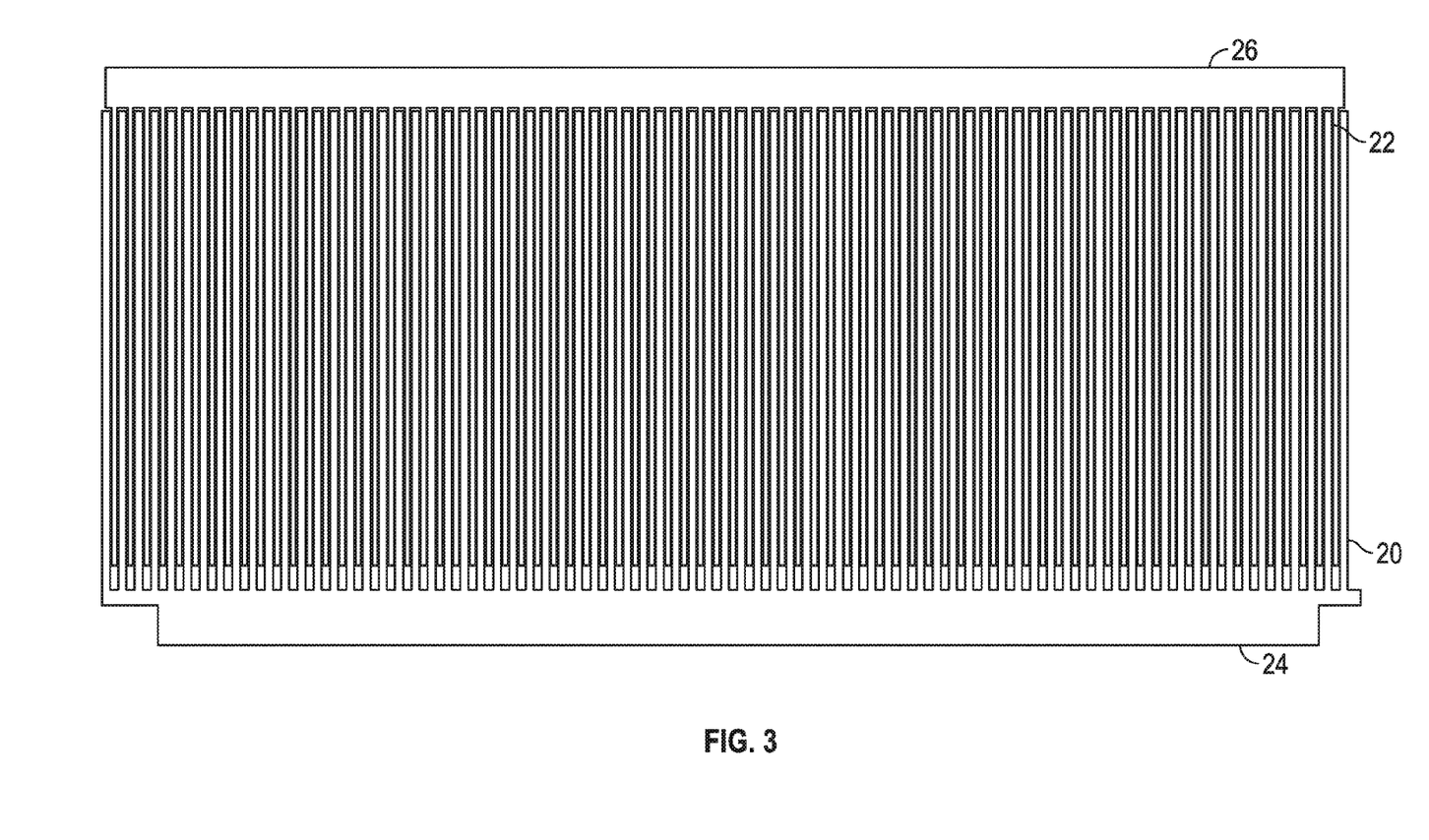
FIG. 3 is a top view of a plurality of source tracks and drain tracks arranged in an interdigitated arrangement.

Referring to FIG. 3, a top down view of an implementation of a plurality of source tracks 20 and a plurality of drain tracks 22 is illustrated. In the implementation illustrated, the source tracks 20 and drain tracks 22 are shown in an interdigitated arrangement, where the source tracks 20 and drain tracks 22 are arranged in an interlocking, alternating arrangement. The interdigitation of the source tracks 20 and drain tracks 22 correspond with similarly arranged source and drain regions on the lateral semiconductor device. In other implementations, the source tracks 20 and drain tracks 22 may be arranged in an interspersed arrangement rather than an interdigitated arrangement. In such an arrangement, the source tracks 20 may be concentrated over one or more source regions on the lateral semiconductor device and the drain tracks 22 may be concentrated over one or more drain regions on the lateral semiconductor device, which are not located in strictly alternating portions of the device but rather dispersed around the device in one or more locations. As can be seen, the various source tracks 20 and drain tracks 22 are joined together at their ends through a main source trace 24 and main drain trace 26.

Figure 4:
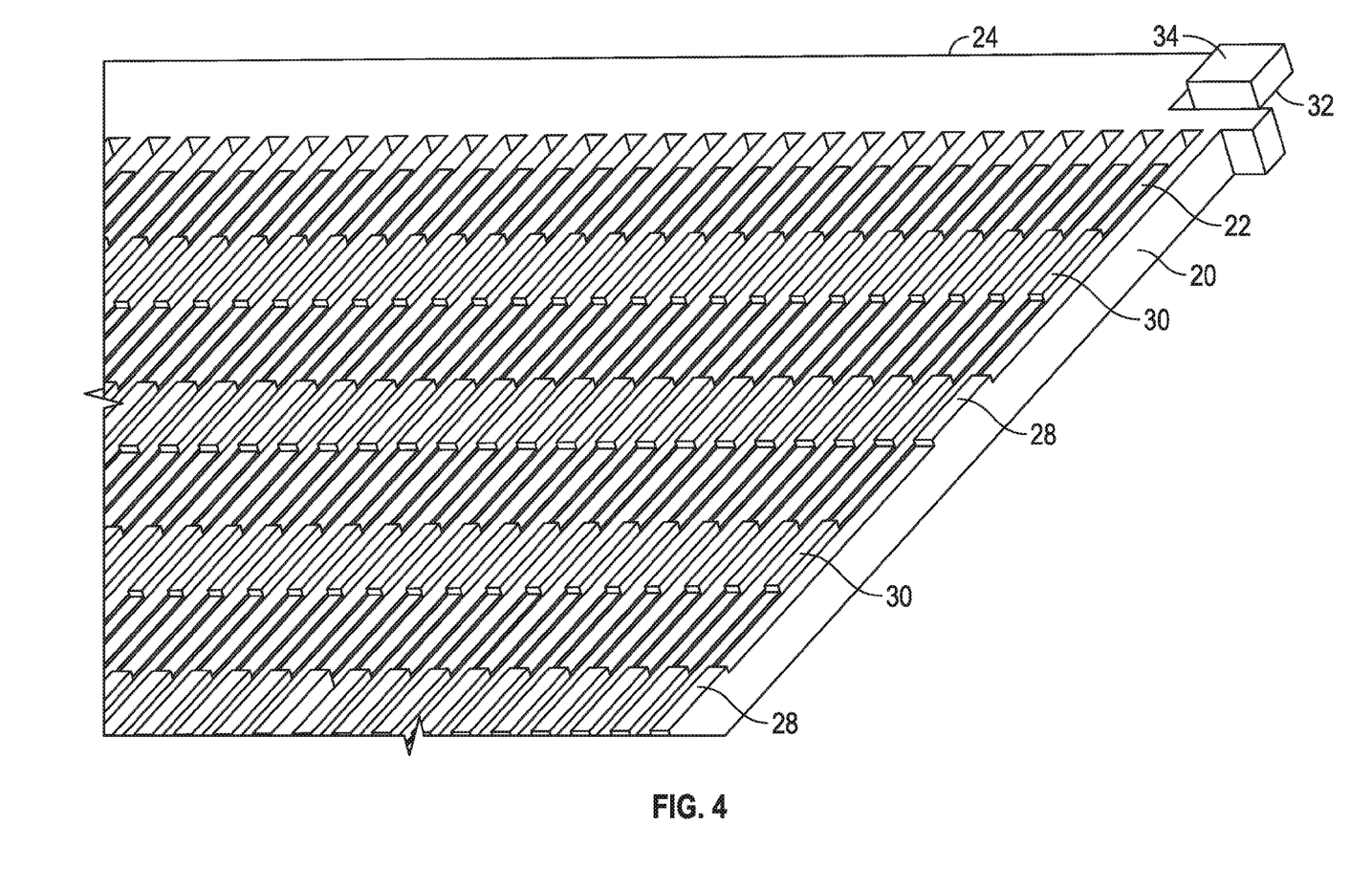
FIG. 4 is perspective view of a plurality of source tracks and drain tracks arranged in an interdigitated arrangement showing a plurality of source standoff contacts and a plurality of drain standoff contacts along with a gate pad and gate standoff contact.

Referring to FIG. 4, a magnified perspective view of the interdigitated plurality of source tracks 20 and drain tracks 22 is illustrated taken at an end of the main source trace 24. As illustrated, the source tracks 20 contain a plurality of source standoff contacts 28 and the drain tracks 22 contain a plurality of drain standoff contacts 30. The pattern of the source standoff contacts 28 and drain standoff contacts 30 can be observed in the figure repeating across the tracks. Also illustrated in FIG. 4 is a gate pad 32 with a gate standoff contact 34 coupled to it. In the implementation illustrated, the gate standoff contact 34 has the same dimensions as the gate pad 32 to which is it coupled; however, in other implementations, the gate standoff contact 34 may have larger or smaller dimensions. The gate standoff contact 34 and the plurality of source standoff contacts 28 and drain standoff contacts 30 may have the same or substantially the same height above the gate pad 32, source tracks 20, and drain tracks 22, respectively. More than one gate pad 32 and/or gate standoff contact 34 may be included as needed by the operational requirements of the lateral semiconductor device. The various standoff contacts disclosed herein may be copper pillars, copper bumps, pads formed by plating one or more metals/materials, or from other conductive materials (i.e., solder, etc.) placed on the source tracks 20, drain tracks 22, and gate pad 32. In a particular implementation, the length of the longest dimension of the standoff contacts may be about 178 microns and they may be made of copper.

Figure 5:
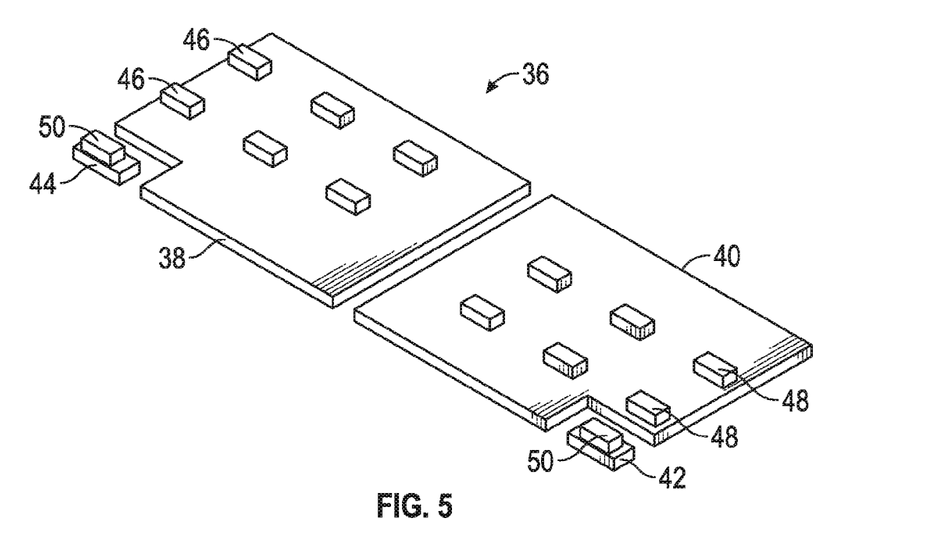
FIG. 5 is a perspective view of a leadframe with a source section, drain section, and two gate sections each physically separate from each other.

Referring to FIG. 5, an implementation of a leadframe 36 is illustrated. As illustrated, the leadframe 36 includes a source section 38, a drain section 40, and gate sections 42, 44. As illustrated, the source section 38 and drain section 40 are physically separate from each other (separate pieces of the leadframe 36) and also physically separate from each of the gate sections 42, 44. Because the source section 38, drain section 40, and gate sections 42, 44, are physically separate, they are electrically isolated from each other. In other implementations, any one or all of the source section, drain section, and gate section may also be electrically isolated but not physically separate through being coupled together through an electrical insulating material or other structure. Also, more than one physically separated/electrically isolated source section 38 and/or drain section 40 may be included in various implementations of leadframes constructed using the principles disclosed herein. As illustrated, the source section 38 contains source clip contacts 46, the drain section 40 contains drain clip contacts 48, and the gate sections 42, 44 contain gate clip contacts 50 which will be discussed hereafter.

In the implementation of a leadframe 36 illustrated in FIG. 5, the face of the leadframe that opposes the one on which the source, drain, and gate clip contacts (back face, not visible in the figure) is designed to be in contact with the motherboard or other mounting socket components to provide electrical connections and/or a connection to a cooling element (heat sink, heat pipe, etc.) to the lateral semiconductor device. In other implementations, the back face may be covered, or substantially covered by mold compound and not used for electrical/thermal connections to the semiconductor package.

The leadframe 36 can be constructed of various electrically conductive materials, including metals and can be formed by stamping, etching, casting, and other forming techniques used for electrically conductive materials. For the exemplary purposes of this disclosure, the leadframe may be ½ etch material that is 250 microns thick and formed of copper with a nickel/silver finish plated or deposited on the surface of the copper.

Figure 6:
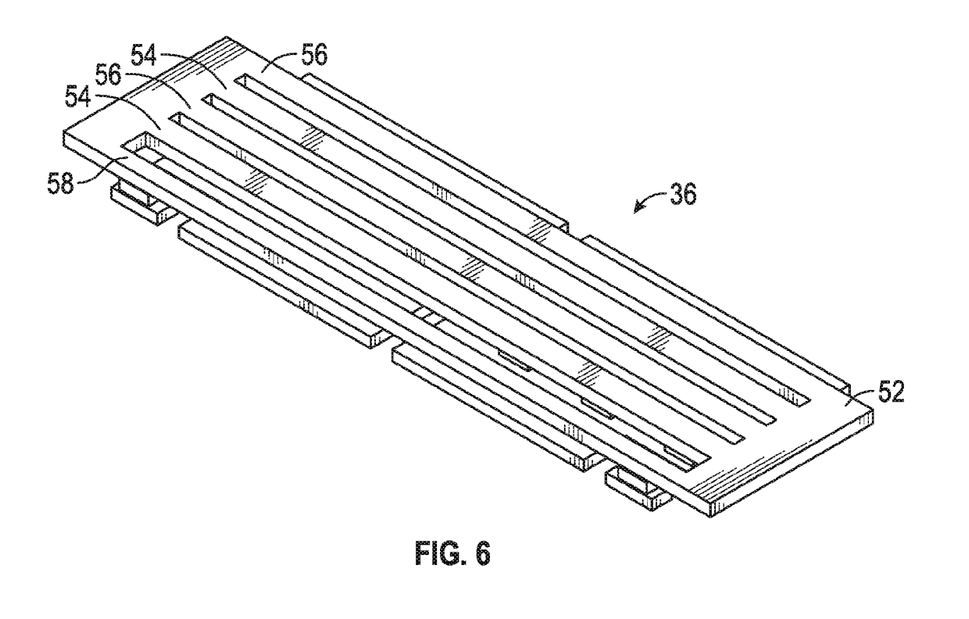
FIG. 6 is a perspective view of the leadframe of FIG. 5 with a single layer clip coupled thereon.
Figure 7:
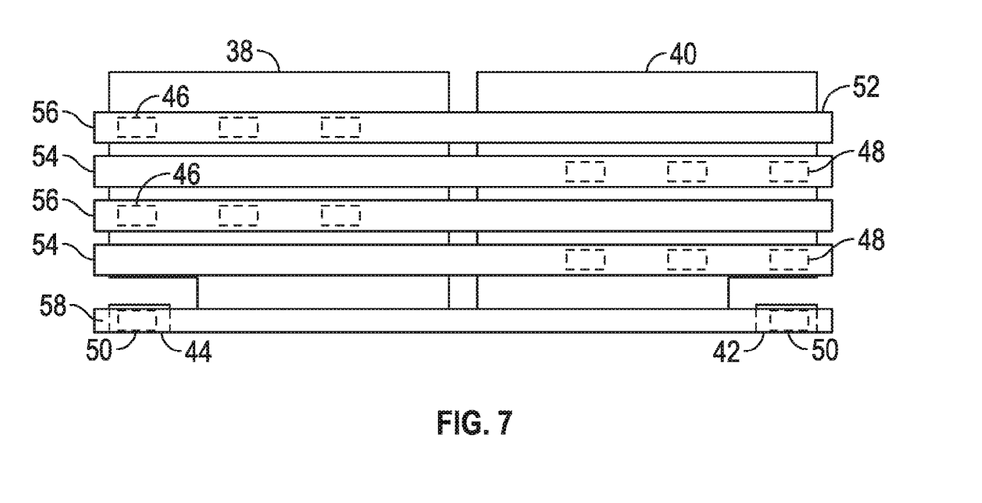
FIG. 7 is a top view of a single layer clip coupled over a leadframe following singulation of the single layer clip.

Referring to FIG. 6, the leadframe 36 illustrated in FIG. 5 is shown coupled to a single layer clip (clip) 52. As illustrated, the single layer clip 52 contains several finger-like projections (fingers) that extend from one end of the clip to the other formed by stamping, forming, casting, or otherwise shaping opening between each of the fingers. In the implementation illustrated, two of the fingers are source fingers 56, two are drain fingers 54, and one is a gate finger 58. The function of each of the fingers is determined by the section of the leadframe 36 that the fingers contact. Referring to FIG. 7, a top view of the clip 52 coupled over the leadframe 36 is illustrated with the end portions of the clip 52 singulated. As illustrated, the position of the source clip contacts 46 is shown in dotted lines at the location where the contacts 46 couple to the source fingers 56. Likewise, the position of the drain clip contacts 48 is shown in dotted lines where the drain fingers 54 couple to the contacts 48 and the position of the gate clip contacts 50 are shown where the drain finger 58 is coupled to the contacts 50. By inspection, it is clear that the source section 38 contacts two alternating fingers and the drain section 40 contacts the other two alternating fingers. In various implementations, the contact pattern for the source section and the drain section may be alternating as illustrated, or may not be, depending upon the design of the lateral semiconductor device and the leadframe 36.

Figure 8:
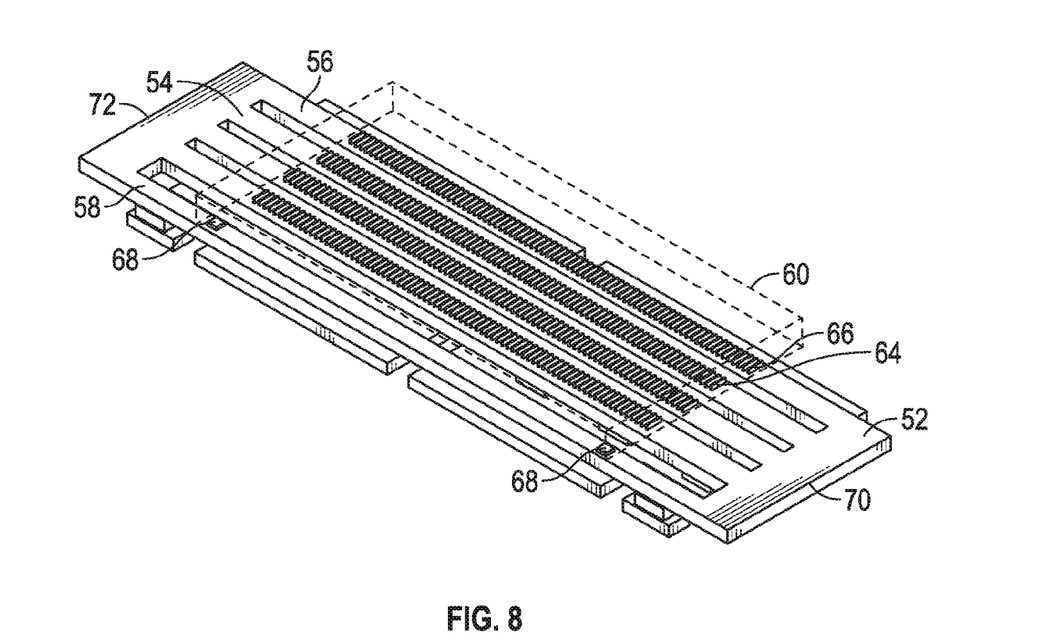
FIG. 8 is a perspective view of the leadframe and single layer clip of FIG. 6 with a lateral semiconductor device coupled thereon showing the plurality of source standoff contacts, plurality of drain standoff contacts, and two gate standoff contacts coupled to the respective fingers of the single layer clip.

Referring to FIG. 8, a lateral semiconductor device 60 is shown coupled to the clip 52 with the bulk of the device shown in dotted lines in order to show the location of the plurality of source standoff contacts 66, the plurality of drain standoff contacts 64, and the gate standoff contacts 68. As illustrated, the plurality of source standoff contacts 66 are arranged in a staggered pattern along the length of the source finger 56 and the plurality of drain contacts 64 are arranged in a staggered pattern along the length of the drain finger 54. The use of the staggering, or distributing, the standoff contacts along the length of the fingers at predetermined intervals may assist with preventing arcing between the source and the drain regions when the semiconductor package is employed in a high voltage application. In addition, because the standoff contacts are located along the length of each finger, during the fabrication process, the standoff contacts may self align with the fingers during a reflow process used to bond the standoff contacts to each finger. As illustrated, the gate standoff contacts 68 are located along the gate finger 58 at locations determined by the design of the lateral semiconductor device 60. In various implementations, there may be more or less than two gate standoff contacts.

At the time that the single layer clip 52 is coupled to the source standoff contacts 66, the drain standoff contacts 64, and the gate standoff contacts 68, the clip 52 at that point electrically provides a simultaneous connection for any source, drain, and gate signals that would flow through the semiconductor device (i.e., shorts or connects them all together). To eliminate the simultaneous connecting of the various signals (regions) of the lateral semiconductor device, the ends 70, 72 of the clip 52 are singulated. The single layer clip 52, accordingly, acts as a redistribution device for the various signals even though it is formed from a single layer of material. For the exemplary purposes of this disclosure, the clip 52 may be made of copper and finished with nickel/silver, and is about 127 microns thick. The width of the source fingers and the drain fingers is 280 microns, and the width of the gate finger is about 218 microns. In addition, the distance between the source fingers and the drain fingers is about 127 microns. The lateral semiconductor device 60 is a GaN die with dimensions of about 2.4 mm by about 5.0 mm and the total size of the semiconductor package is about 2.8 mm by about 6.8 mm.

Figure 9:
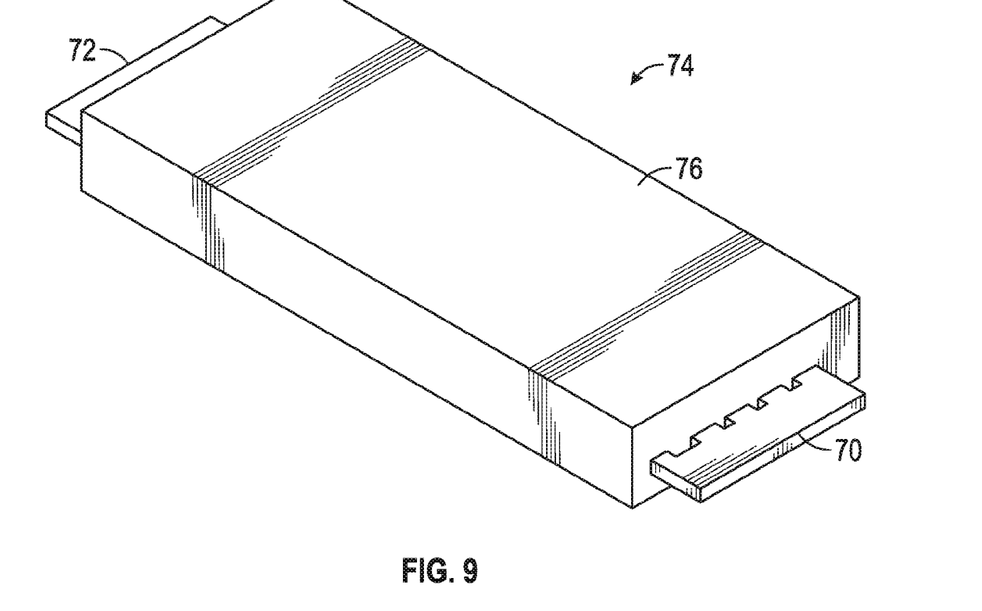
FIG. 9 is a perspective view of the leadframe of FIG. 8 after molding with mold compound.
Figure 10:
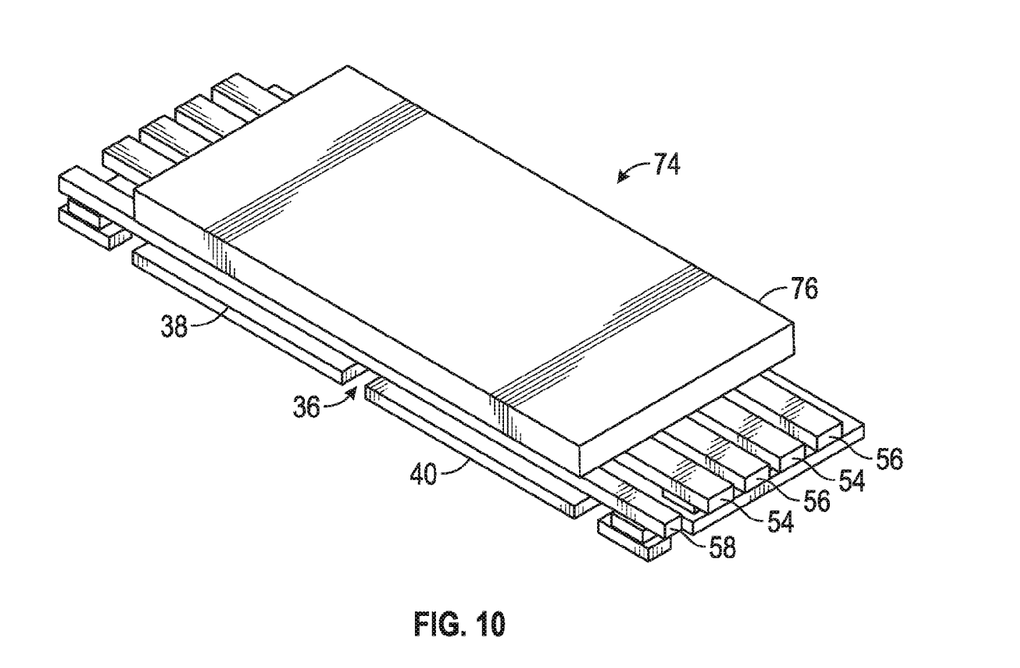
FIG. 10 is a perspective view of the leadframe of FIG. 9 with the mold compound removed following singulation of the single layer clip to form a semiconductor package.

Referring to FIG. 9, the semiconductor package 74 is shown following a molding/encapsulating step that covers the lateral semiconductor device 60, a majority of the clip 52, and the surface of the leadframe 36 that faces the lateral semiconductor device 62 with mold compound 76. Any of a wide variety of molding/encapsulating processes may be employed in various package implementations. As can be seen, the ends 70, 72 remain exposed following the molding step. Referring to FIG. 10, the semiconductor package 74 is shown following singulation with the mold compound removed following singulation of the ends 70, 72 of the clip 52 to best show how the removal of the ends 70, 72 permits the source fingers 56 and the drain fingers 54 to be physically and electrically separated from each other and from the gate finger 58. Referring to the diagram in FIG. 7 in combination with FIG. 10 it will be noted that the source fingers 56 and the drain fingers 54 are supported above the source section 38 and the drain section 40 of the leadframe through the source clip contact 46 and the drain source contact 48, respectively, but only at one end of the respective fingers. Because the molding step fills the spaces between the leadframe 36, the clip 52, and the lateral semiconductor device 60, each of the fingers is fully mechanically supported by the mold compound at the end not in contact with the leadframe 36 prior to singulation and removal of the ends 70, 72.

In various implementations, the resulting semiconductor package 74 may receive electrical signals only through the leadframe 36. In other implementations, the semiconductor package 74 may also receive signals/power also through one or more of the source finger 56, drain finger 54, and/or the gate finger 58. In such implementations, the various fingers may not be singulated flush with the edge of the mold compound 76, but a remaining portion of one or more of the fingers may extend from the edge of the mold compound.

Implementations of semiconductor packages 74 like those disclosed herein may improve the current flow out of the package, reduce resistance from the package structure by shortening the current path into and out of the package, and improve alignment to the leadframe and to the standoff contacts during the assembly and reflow processes. Such packages may also improve the structural integrity of the package 74 by using only one clip rather than multiple clips. Furthermore, the use of a single layer clip that has multiple fingers separable via singulation and the coupling of the device to the fingers via standoff contacts reduces the package component count by eliminating any other clips and any wirebonding.

Implementations of semiconductor packages like those disclosed herein may be manufactured using implementations of a method of manufacture. Method implementations may include coupling a single layer clip 52 with at least one source finger 56, at least one drain finger 54, and at least one gate finger 58 to a plurality of source and drain standoff contacts 66, 64, respectively, and to one or more gate standoff contacts 68 that are included in a lateral semiconductor device 60. In various implementations, coupling includes bonding the standoff contacts to the fingers through a reflow process. The method also includes coupling a leadframe 36 to the single layer clip 52. In various implementations, the leadframe 36 includes at least one source section 38, at least one drain section 40, and at least one gate section 42, 44. In various implementations, all of the sections of the leadframe 36 are coupled at the same time to the single layer clip 52; however, in some implementations, one or more of them may be coupled at different times/steps of the manufacturing process. The method also includes overmolding and/or encapsulating the lateral semiconductor device 60, a majority of the single layer clip 52, and the face of the leadframe 36 that faces the lateral semiconductor device 60 with a mold/encapsulating compound. The method includes singulating the at least one source finger 56, the at least one drain finger 54, and the at least one gate finger 58.

Implementations of the method may also include forming the source and drain tracks and the gate pad, the various standoff contacts, and the formation of the source, drain, and gate pads in an interspersed arrangement or an interdigitated arrangement. Those of ordinary skill will readily be able to use the principles disclosed herein to devise various methods of manufacture of packages for lateral semiconductor devices like those disclosed herein.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor device package comprising:
   a lateral semiconductor device comprising one of interspersed and interdigitated source and drain regions and one or more gate regions;
   a single layer clip;
   a leadframe;
   a plurality of source pads and a plurality of drain pads coupled to the source and drain regions and the one or more gate regions, the plurality of source pads and plurality of drain pads arranged in one of an interspersed arrangement and an interdigitated arrangement with respect to each other;
   a plurality of source tracks coupled to the plurality of source pads, the plurality of source tracks comprising a plurality of source standoff contacts;
   a plurality of drain tracks coupled to the plurality of drain pads, the plurality of drain tracks comprising a plurality of drain standoff contacts; and
   at least one gate pad, the at least one gate pad coupled to one or more gate standoff contacts;
   wherein the single layer clip is coupled to the one of interspersed and interdigitated source and drain regions and the one or more gate regions and to the leadframe;
   wherein the single layer clip is configured to redistribute and to isolate source, drain, and gate signals passing into and out from the lateral semiconductor device during operation of the semiconductor device package.

2. The semiconductor device package of claim 1, further comprising mold compound enclosing the lateral semiconductor device, a majority of the single layer clip, and a side of the leadframe facing the lateral semiconductor device.

3. The semiconductor device package of claim 1, further comprising wherein the single layer clip comprises at least one source finger, at least one drain finger, and at least one gate finger, each of the at least one source finger, the at least one drain finger, and the at least one gate finger are coupled with the plurality of source standoff contacts, the plurality of drain standoff contacts, and the one or more gate standoff contacts, respectively.

4. The semiconductor package of claim 3, wherein the plurality of source standoff contacts, the plurality of drain standoff contacts, and the one or more gate standoff contacts are each arranged in a staggered pattern along a length of the at least one source finger, the at least one drain finger, and the at least one gate finger, respectively.

5. The semiconductor package of claim 3, wherein the plurality of source standoff contacts, the plurality of drain standoff contacts, and the one or more gate standoff contacts are configured to self align to the single layer clip during a reflow process used during fabrication of the semiconductor package.

6. The semiconductor device package of claim 3, further comprising wherein the leadframe comprises at least one source section, at least one drain section, and at least one gate section, each of the at least one source section, the at least one drain section, and the at least one gate section comprising a source clip contact, drain clip contact, and a gate clip contact, respectively.

7. The semiconductor device package of claim 6, further comprising wherein the source clip contact, drain clip contact, and gate clip contact extend from a plane of the leadframe oriented parallel to the single layer clip and wherein the leadframe is coupled to the single layer clip at the source clip contact, the drain clip contact, and the gate clip contact.

8. The semiconductor package of claim 7, wherein the at least one source section, the at least one drain section, and the at least one gate section of the leadframe are physically separate from each other.

9. A semiconductor device package comprising:
   a lateral semiconductor device comprising:
   a plurality of source pads and a plurality of drain pads, the plurality of source pads and plurality of drain pads arranged in one of an interspersed arrangement and an interdigitated arrangement with respect to each other;
   a plurality of source tracks coupled to the plurality of source pads, the plurality of source tracks comprising a plurality of source standoff contacts;
   a plurality of drain tracks coupled to the plurality of drain pads, the plurality of drain tracks comprising a plurality of drain standoff contacts; and at least one gate pad, the at least one gate pad coupled to one or more gate standoff contacts;

a single layer clip comprising at least one source finger, at least one drain finger, and at least one gate finger, each of the at least one source finger, the at least one drain finger, and the at least one gate finger coupled with the plurality of source standoff contacts, the plurality of drain standoff contacts, and the one or more gate standoff contacts, respectively;

a leadframe comprising at least one source section, at least one drain section, and at least one gate section, each of the at least one source section, the at least one drain section, and the at least one gate section comprising a source clip contact, drain clip contact, and a gate clip contact, respectively;

wherein the source clip contact, drain clip contact, and gate clip contact extend from a plane of the leadframe oriented parallel to the single layer clip;

wherein the leadframe is coupled to the single layer clip at the source clip contact, the drain clip contact, and the gate clip contact.

10. The semiconductor package of claim 9, further comprising mold compound enclosing the lateral semiconductor device, a majority of the single layer clip, and a side of the leadframe facing the lateral semiconductor device.

11. The semiconductor package of claim 9, wherein the plurality of source standoff contacts, the plurality of drain standoff contacts, and the one or more gate standoff contacts are each arranged in a staggered pattern along a length of the at least one source finger and a length of the at least one drain finger, respectively.

12. The semiconductor package of claim 9, wherein the at least one source section, the at least one drain section, and the at least one gate section of the leadframe are physically separate from each other.

13. The semiconductor package of claim 9, wherein the single layer clip is configured to connect multiple signal types from the lateral semiconductor device when coupled to the lateral semiconductor device during fabrication of the semiconductor package and then to isolate those multiple signal types following singulation of the semiconductor package.

14. The semiconductor package of claim 9, wherein the plurality of source standoff contacts, the plurality of drain standoff contacts, and the one or more gate standoff contacts are configured to self align to the single layer clip during a reflow process used during fabrication of the semiconductor package.

* * * * *